United States Patent [19]

Ganio

[11] Patent Number: 5,166,623
[45] Date of Patent: Nov. 24, 1992

[54] METHOD FOR INDICATING BATTERY CAPACITY

[75] Inventor: Christopher Ganio, Sunrise, Fla.

[73] Assignee: Motorola, Inc., Schaumburg, Ill.

[21] Appl. No.: 664,141

[22] Filed: Mar. 4, 1991

[51] Int. Cl.⁵ ............................. G01N 27/416
[52] U.S. Cl. ............................. 324/427; 324/433; 340/636; 320/32; 320/39
[58] Field of Search ............ 324/426, 427, 428, 433; 340/636; 320/48, 31, 32, 40, 39

[56] References Cited

U.S. PATENT DOCUMENTS

| | | | |
|---|---|---|---|
| 3,877,001 | 4/1975 | Bogut et al. | 340/249 |
| 4,027,231 | 5/1977 | Lohrmann | 324/433 |
| 4,388,582 | 6/1983 | Saar et al. | 320/39 X |
| 4,503,378 | 3/1985 | Jones et al. | 320/40 X |
| 4,595,880 | 6/1986 | Patil | 324/427 |
| 4,677,363 | 6/1987 | Kopmann | 320/32 X |
| 4,746,852 | 5/1988 | Martin | 320/31 X |
| 4,806,840 | 2/1989 | Alexander et al. | 320/44 X |
| 4,829,290 | 5/1989 | Ford | 340/663 |
| 5,027,294 | 6/1991 | Fakruddin et al. | 324/426 X |
| 5,061,898 | 10/1991 | Oram et al. | 324/427 |

Primary Examiner—Jack B. Harvey
Assistant Examiner—Glenn W. Brown
Attorney, Agent, or Firm—Robert S. Babayi

[57] ABSTRACT

Battery capacity in a portable two-way radio is determined by measuring the voltage across the battery at predetermined time intervals and determining battery voltage slopes. Each battery voltage slope is compared with a previously determined battery voltage slope and the battery capacity is determined by analyzing the changing pattern of the battery voltage slopes.

4 Claims, 3 Drawing Sheets

METHOD FOR INDICATING BATTERY CAPACITY

TECHNICAL FIELD

This invention relates generally to the field of battery operated devices, and in particular to a method of indicating battery capacity to an operator.

BACKGROUND

In many types of battery operated electronic equipments, especially portable two-way radios and the like, it is desirable to have some indication of the status of the battery. Further, it is not only desirable to know whether the battery is charged or discharged but it is also desirable to know when the battery voltage is low. Thus, when the battery is low the operator can replace the battery with a completely charged battery without substantially interrupting the operation of the equipment.

Conventionally, the portable two-way radio's include a battery status indicator device which continuously indicate the condition of the battery by monitoring the voltage across battery terminals and comparing the voltage against a predetermined end of life voltage. If the voltage drops below the end of life voltage a low capacity status is indicated by means of, for example a flashing light. In some applications the flashing light may be at a rate depending upon the charge of the battery.

However, the end of life voltage is susceptible to many factors, such as ambient temperature, battery age, battery self discharge, etc., which are independent of the actual battery capacity. Therefore, erroneous battery status indications may be given to the operator causing him to overcharge the battery unnecessarily, therefore possibly damaging battery cells.

It is desired to provide to a substantially accurate battery capacity indicator which is independent from ambient and peripheral factors which effect the battery voltage.

SUMMARY OF THE INVENTION

Briefly, according to the invention, battery capacity is determined by measuring battery voltages at predetermined time intervals and determining battery voltage slopes therefrom. Each battery voltage slope is compared with a previously determined battery voltage slope and the battery capacity is indicated by analyzing the change in the battery voltage slopes. If the battery voltage slopes are substantially decreasing a full capacity is indicated. If the battery voltage slopes are substantially constant a substantially intermediate capacity is indicated. Finally, if the battery voltage slopes are increasing an empty battery capacity is indicated.

DETAILED DESCRIPTION OF THE PREFERRED EMBODIMENT

Figure 1:
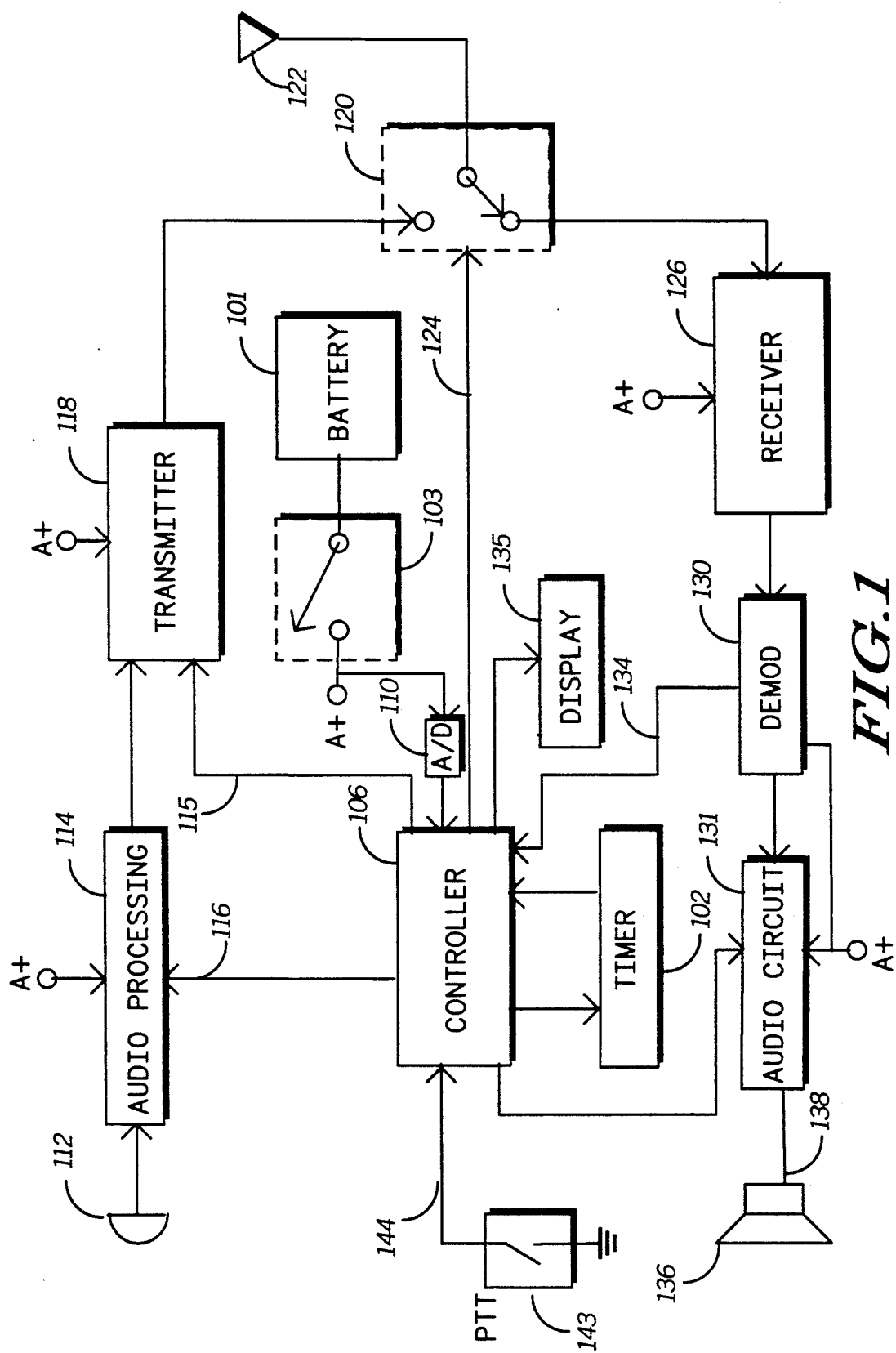
FIG. 1, shows block diagram of a radio and a battery incorporating the principals of the present invention.

Referring to FIG. 1, shown is a block diagram of a battery operated radio which incorporates the principals of the present invention. The radio may comprise any suitable battery operated portable radio, such as Saber portable two-way radio manufactured by Motorola Inc, which communicates information with other mobile or portable radio units operating in a communication system. The radio is powered by a battery 101, which provides a supply voltage A+ to various operational blocks of the radio. The radio includes a microcontroller 106 for, controlling various circuits and sections to transmit and receive information in a well known manner.

In transmit mode, audio information impressed upon a microphone 112 is received by an audio processing unit 114, which may be of conventional design. In order to transmit information a push-to-talk (PTT) button 143 is activated which generates a PTT signal 144. In response to the PTT signal 144, the microcontroller 106 activates (116) the audio processing unit, which supplies the processed audio information to a transmitter 118. The transmitter 118 is selectively coupled (via an antenna switch 120) to an antenna 122 to radiate information. Data information may also be transmitted when provided by the microcontroller 106 to the transmitter 118 via a data line 115.

In receive mode, the antenna switch 120 is controlled (124) by the microcontroller 106 to couple the antenna 122 to a receiver 126. A recovered baseband signal is processed by a demodulator 130 and applied to an audio amplifier circuit 131 to be presented to a speaker 136. When no communication information is received, the radio remains in stand by mode and an active squelch signal generated by the demodulator 130 is applied to the controller 106 to disable the audio amplifier circuit 131 from applying noise signals to the speaker 136. When communication information is received the the squelch signal 134 enables the audio amplifier circuit 131 and voice (audio) information 138 is routed from the audio amplifier circuit 131 to the speaker 136. Data messages including battery capacity may also be processed by the controller 106 and be presented to an operator via a display 135.

In the preferred embodiment of the present invention, the battery 101 includes six series coupled nickle-cadmium battery cells, each battery cell having a nominal battery voltage of 1.25 volts. Therefore, the battery 101 provides a total battery voltage of 7.5 volts. The battery cells have an end of life voltage of 1 volt and, and when the battery voltage across the battery 101 drops to below 6 volts the capacity of the the battery is presumed to be depleted. According to the invention, the capacity of the battery 101 is determined by periodically measuring the battery voltage at predetermined time intervals and calculating battery voltage slopes. The battery voltage slopes are calculated by subtracting each battery voltage measurement with a previous battery voltage measurement and dividing it by the predetermined time interval. Each battery voltage slope is compared with a previously determined battery voltage slope. The result of the comparison is analyzed to determine the battery capacity. In order to measure the battery voltage, positive terminal of the battery 101 is applied to an analog to digital converter 110 which provides digital representation of the battery voltage.

The digital representation of the battery voltage is applied to the controller 106 for processing according to the invention. A timer 102 which is programmable by the controller 106 provides the timing for periodic measurement of the battery voltage in a well known manner.

Figure 2:
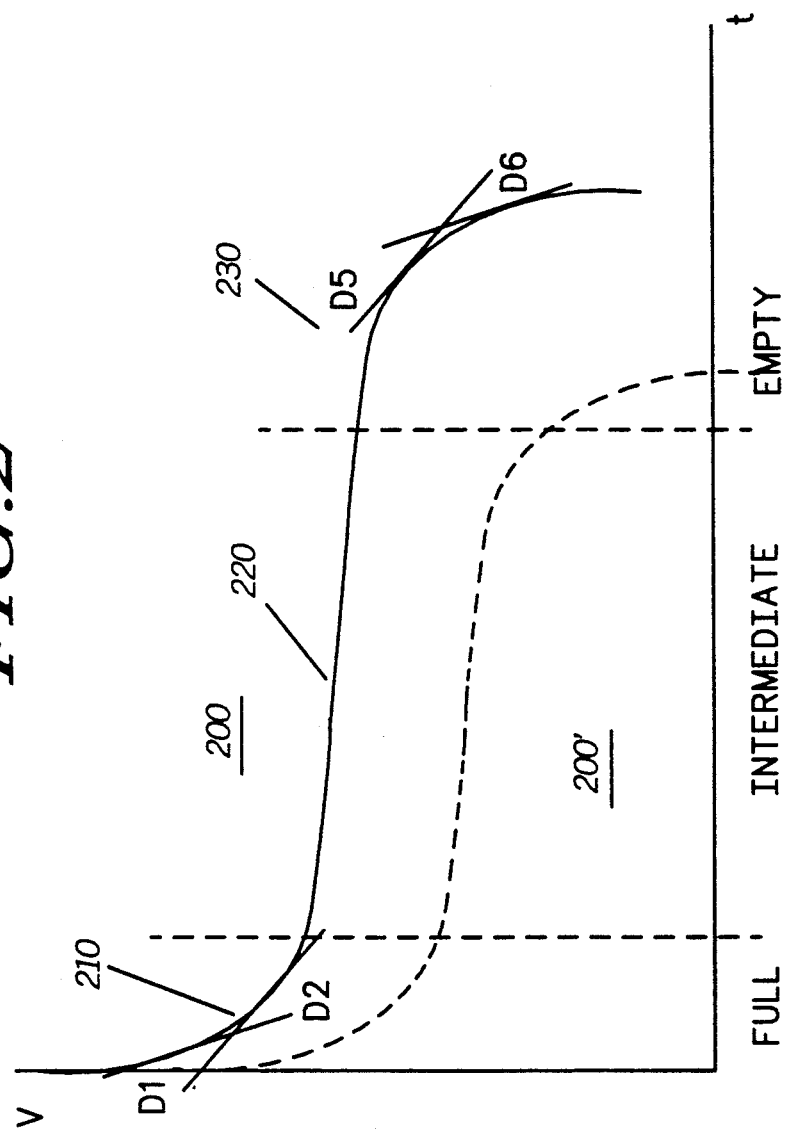
FIG. 2, is a graph of capacity characteristic of the battery of FIG. 1.

Referring to FIG. 2, battery capacity characteristics graphs 200 and 200' show the battery voltage variations of the battery 101 over time under two current conditions. The battery capacity graph 200 shows the battery voltage variations when small amount of current is being supplied by the battery 101, such as when the radio is in the standby mode. The graph 200' shows the battery voltage variations when substantially more current is being supplied by the battery, such as when the radio is in the transmit mode. As it can be seen, the battery voltage variations are substantially similar, the only difference being that the battery reaches end of life voltage faster when substantially more current is being drawn from the battery. The battery capacity graph 200 (or graph 200') may be divided into three capacity regions: a full capacity region 210, an intermediate capacity region 220, and an empty capacity region 230. In the full capacity region 210, the battery voltage rapidly decreases over time until it reaches the intermediate capacity region. Experiments show that when the battery voltage reaches the intermediate capacity region 220 between 85% to 90% of capacity remains in the battery 101. In the intermediate capacity region the battery voltage remains substantially constant until it reaches the empty capacity region where the battery voltage again decreases very rapidly passing its end of life voltage. At the end of the intermediate capacity region only 10-15% of the capacity remains in the battery. One of ordinary skill in the art appreciates that the battery voltage slopes in the full capacity region 210 (as shown by lines D1 and D2) have a substantially decreasing value where the battery voltage slopes in the intermediate capacity region 220 are substantially constant. Finally, the battery voltage slopes start increasing in the empty capacity region 230 (as shown by lines D5 and D6). Therefore, by comparing consecutive battery voltage slopes with previously calculated battery voltage slopes, the battery capacity region may be determined.

In the preferred embodiment of the invention, the battery capacity is indicated as "FULL" if the battery capacity is determined to be within the full capacity region 210. The battery capacity is indicated as "USED" if the battery capacity is determined to be within the intermediate capacity region 220, and as "EMPTY" if the battery capacity is determined to be in the empty capacity region 230. The battery capacity is indicated to the operator by means of the diplay block 135.

Figure 3:
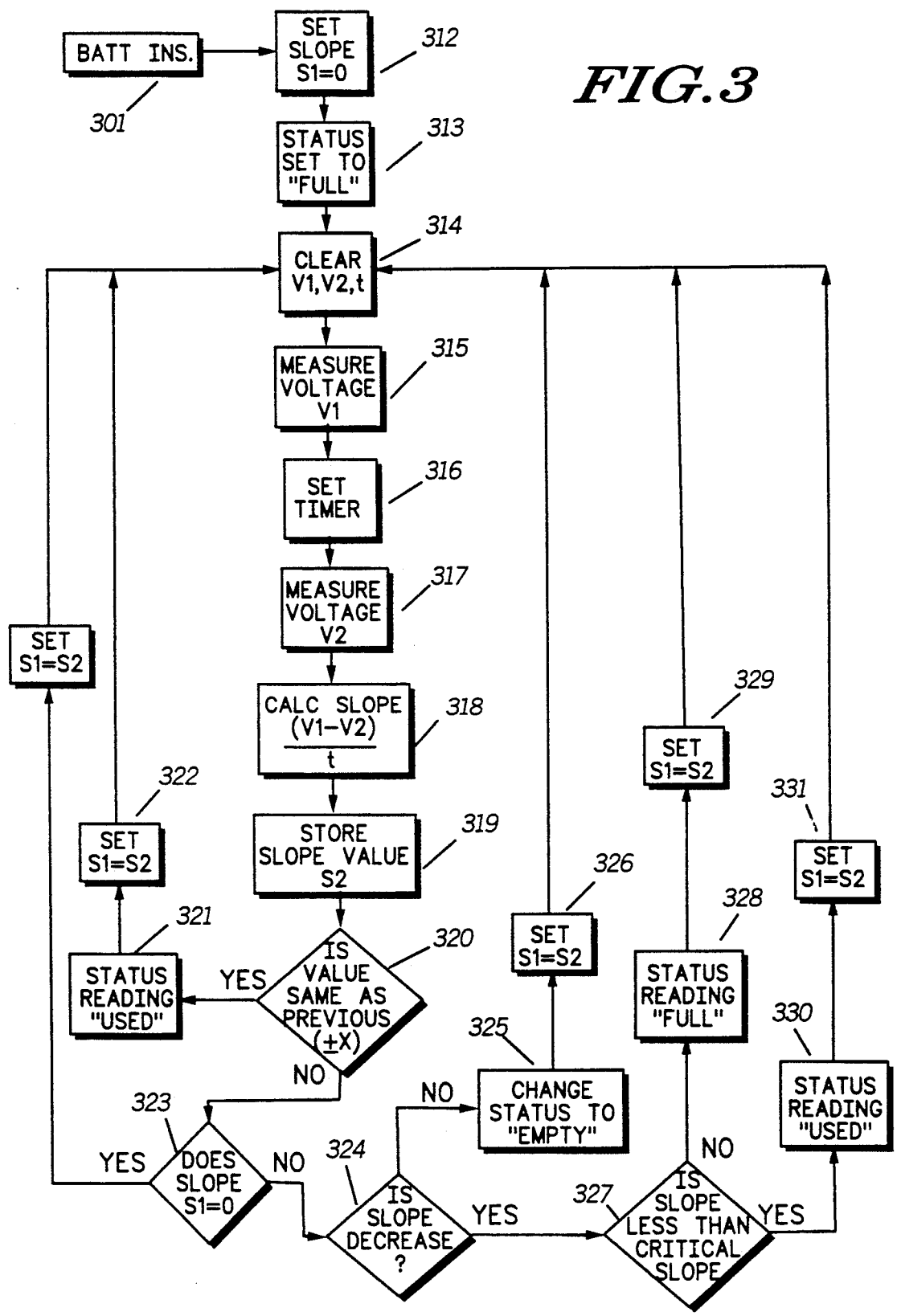
FIG. 3, is the flow chart of the steps taken for determining the battery capacity according to the present invention.

Referring to FIG. 3, a flow chart of the method for determining the battery capacity according to the invention is shown. It may be appreciated that the flow chart of FIG. 3 may be implemented as an executable program by the controller 106. The program starts at block 301 when the radio is turned on or a battery is inserted into the radio. The program proceeds to initialize a first battery voltage slope S1 and status of the battery is set to a default full capacity, blocks 312 and 313. A first and a second battery voltage measurements V1 and V2 as well as a time parameter T are also cleared, block 314. The first voltage measurement V1 is made, block 315, and the timer 102 of FIG. 2 is set to wait the time T before taking the second battery voltage measurement V2, block 317. The time T in the preferred embodiment of the present invention comprise 15 seconds. The second battery voltage measurement V2 is made, block 317, and the battery voltage slope S2 is calculated, block 318. The second voltage slope is stored in a temporary memory storage device within the controller 106, block 319. Comparison is made between the battery slope S1 and a previously calculated battery slope S2, block 320, to determine whether the battery voltage slopes are substantially constant. The comparison takes into consideration a predetermined tolerance (+/−X) within which the difference between the first and the second battery voltage slopes is allowed to fluctuate and still be considered as constant. If the battery voltage slopes are constant, it is determined that the battery capacity is within the intermediate capacity region and the capacity status of "USED" is indicated, block 321. The first battery voltage slope S1 is set to the second battery voltage slope S2 and the program returns to the block 314. If the first battery slopes as compared in block 320 are not constant a determination is made as to whether the battery voltage slope S1 is a non zero value, block 323. If the first battery voltage slope S1 is equal to zero the first battery voltage slope S1 is set to the second battery voltage slope S2 and, the program returns to block 314 to calculate the second battery voltage slope S2. If the first battery voltage slope S1 is not equal to zero, determination is made as to whether the battery voltage slope is decreasing, block 324. If the battery voltage slope is not decreasing, it is determined that the battery voltage slope is increasing and the battery capacity is within the empty capacity region 230. In this case, the capacity status of "EMPTY" is indicated, block 325. Then, the first battery voltage slope S1 is set to be equal to the second battery voltage slope S2 and the program returns to the block 314, block 326. If the battery voltage slope is decreasing, a determination is made as to whether the battery voltage slope S2 is less than a predetermined critical value, block 327, if so the "USED" battery status is indicated, block 328. The predetermined critical battery voltage slope is stored in the memory and comprises an experimentally determined value below which the battery capacity is presumed to be in the intermediate capacity region 220. The first battery voltage slope S1 is again set to be equal to the second battery voltage slope S2, block 329. If the battery voltage slope values are decreasing, but battery voltage slope is greater than the predetermined critical slope, it is determined that the battery capacity is in the full capacity region 210 and a "FULL" capacity status is indicated, block 330. The first battery voltage slope S1 is set to be equal to the second battery voltage slope S2 in block 329.

It is well known that during normal operation, the radio remains in the standby mode for substantially longer period of time than in the transmit mode. In fact, the battery's operational life is rated by assuming that the radio will be in the standby and the receive modes for 95% of the time and in the transmit mode for 5% of the time. The battery voltage slopes may be determined during any combination of the radio modes. Additional intelligence may be added to the operational program of the present invention to make battery slope determinations during the standby, the receive or the transmit mode to determine the battery capacity. Preferably, however, if the battery slopes are determined when the radio is in the standby mode premature low capacity indications which occur if battery voltage measurements were made during transmit mode are prevented. Additional intelligence may also be added to ignore battery voltage measurements caused by sudden changes in the external factors, such as temperature.

What is claimed is:

1. A method for determining battery capacity comprising the steps of:
   measuring battery voltages at predetermined time intervals;
   determining battery voltage slopes by comparing each battery voltage with a previously measured battery voltage;
   continuously comparing each battery voltage slope with a previously determined battery voltage slope;
   indicating a substantially full battery capacity if said battery voltage slopes are substantially decreasing;
   indicating a substantially intermediate battery capacity if said battery voltage slopes are substantially constant; and
   indicating a substantially empty battery capacity if said battery voltage slopes are substantially increasing.

2. In a battery having a capacity characteristic separated into a full capacity region, an intermediate capacity region, and an empty capacity region, wherein said full capacity region has a substantially decreasing battery voltage slope, and said intermediate capacity region has a substantially constant battery voltage slope, and said empty capacity region has a substantially increasing battery voltage slope; a method for determining battery capacity comprising the steps of:
   measuring battery voltage provided by said battery at predetermined time intervals;
   determining battery voltage slopes by comparing each battery voltage with a previously measured battery voltage;
   continuously comparing each battery voltage slope with a previously determined battery voltage slope;
   indicating a substantially full battery capacity if said battery voltage slopes are substantially decreasing;
   indicating a substantially intermediate battery capacity if said battery voltage slopes are substantially constant; and
   indicating a substantially empty battery capacity if said battery voltage slopes are substantially increasing.

3. An apparatus for determining battery capacity comprising:
   means for measuring battery voltages provided by said battery at predetermined time intervals;
   means for determining battery voltage slopes by comparing each battery voltage with a previously measured battery voltage;
   means for continuously comparing each battery voltage slope with a previously determined battery voltage slope;
   means for indicating a substantially full battery capacity if said battery voltage slopes are substantially decreasing;
   means for indicating a substantially intermediate battery capacity if said battery voltage slopes are substantially constant; and
   means for indicating a substantially empty battery capacity if said battery voltage slopes are substantially increasing.

4. In a battery having a capacity characteristic separated into a full capacity region, an intermediate capacity region, and an empty capacity region, wherein said full capacity region has a substantially decreasing battery voltage slope, and said intermediate capacity region has a substantially constant battery voltage slope, and said empty capacity region has a substantially increasing battery voltage slope; an apparatus for determining battery capacity comprising:
   means for measuring battery voltages provided by said battery at predetermined time intervals;
   means for determining battery voltage slopes by comparing each battery voltage with a previously measured battery voltage;
   means for continuously comparing each battery voltage slope with a previously determined battery voltage slope;
   means for indicating a substantially full battery capacity if said battery voltage slopes are substantially decreasing;
   means for indicating a substantially intermediate battery capacity if said battery voltage slopes are substantially constant; and
   means for indicating a substantially empty battery capacity if said battery voltage slopes are substantially increasing.

* * * * *